United States Patent
Domes (10) Patent No.: US 11,315,906 B2
(45) Date of Patent: Apr. 26, 2022

(54) SEMICONDUCTOR ARRANGEMENTS

(71) Applicant: Infineon Technologies AG, Neubiberg (DE)

(72) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 192 days.

(21) Appl. No.: 16/775,632

(22) Filed: Jan. 29, 2020

(65) Prior Publication Data
US 2020/0243489 A1 Jul. 30, 2020

(30) Foreign Application Priority Data

Jan. 30, 2019 (EP) .................................... 19154622

(51) Int. Cl.
| | |
|---|---|
| *H01L 25/07* | (2006.01) |
| *H01L 23/367* | (2006.01) |
| *H01L 23/50* | (2006.01) |
| *H01L 25/18* | (2006.01) |

(52) U.S. Cl.
CPC .......... *H01L 25/072* (2013.01); *H01L 23/367* (2013.01); *H01L 23/50* (2013.01); *H01L 25/18* (2013.01)

(58) Field of Classification Search
CPC ... H01L 23/367; H01L 23/50; H01L 23/5386; H01L 25/072; H01L 25/18; H02M 7/003
See application file for complete search history.

(56) References Cited

U.S. PATENT DOCUMENTS

| | | | |
|---|---|---|---|
| 2006/0274561 A1 | 12/2006 | Ahmed et al. | |
| 2012/0018741 A1* | 1/2012 | Sato ........................ | H01L 24/01 257/77 |
| 2015/0155797 A1* | 6/2015 | Okayama .............. | H01L 25/072 363/131 |

FOREIGN PATENT DOCUMENTS

WO    2018202620 A1    11/2018

* cited by examiner

*Primary Examiner* — Allan R Wilson
(74) *Attorney, Agent, or Firm* — Murphy, Bilak & Homiller, PLLC (57) ABSTRACT

A semiconductor arrangement includes at least two switching devices of a first type electrically coupled in parallel between a first terminal and a second terminal, and at least two switching devices of a second type electrically coupled in parallel between the second terminal and a third terminal. The switching devices of the first type and the switching devices of the second type are arranged in a power semiconductor module that has first and second longitudinal sides and first and second narrow sides. The switching devices of the first type and the switching devices of the second type are arranged next to each other in at least one row extending in a first horizontal direction that is parallel to the first and second longitudinal sides, such that within each of the at least one rows no more than two switching devices of the same type are arranged in direct succession.

16 Claims, 6 Drawing Sheets

SEMICONDUCTOR ARRANGEMENTS

TECHNICAL FIELD

The instant disclosure relates to semiconductor arrangements, in particular to semiconductor arrangements for power semiconductor modules.

BACKGROUND

Power semiconductor module arrangements often include a base plate within a housing. At least one substrate is arranged on the base plate. A semiconductor arrangement including a plurality of controllable semiconductor components (e.g., two or more IGBTs in a half-bridge configuration) is usually arranged on at least one of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. The layout of the semiconductor arrangement is usually chosen such that electrical losses in the arrangement are kept at a minimum. Further, an unequal distribution of electrical losses within the power semiconductor module should be prevented. Even further, it is desirable to prevent thermal hot spots on the at least one substrate.

There is a need for an improved semiconductor arrangement with reduced electrical losses that has a distribution of electrical losses that is as equal as possible, and wherein thermal hot spots are prevented as far as possible.

SUMMARY

A semiconductor arrangement includes at least two switching devices of a first type, electrically coupled in parallel between a first terminal and a second terminal, and at least two switching devices of a second type, electrically coupled in parallel between the second terminal and a third terminal. The switching devices of the first type and the switching devices of the second type are arranged in a power semiconductor module, the power semiconductor module comprising first and second longitudinal sides and first and second narrow sides. The switching devices of the first type and the switching devices of the second type are arranged next to each other in at least one row extending in a first horizontal direction that is parallel to the first and second longitudinal sides such that within each of the at least one rows no more than two switching devices of the same type are arranged in direct succession.

Another semiconductor arrangement includes at least two switching devices of a first type, electrically coupled in parallel between a first terminal and a second terminal, wherein one of a plurality of first diodes is electrically coupled in parallel to each of the at least two switching devices of the first type and at least two switching devices of a second type, electrically coupled in parallel between the second terminal and a third terminal, wherein one of a plurality of second diodes is electrically coupled in parallel to each of the at least two switching devices of the second type. The switching devices of the first type and the switching devices of the second type are arranged in a power semiconductor module, the power semiconductor module comprising first and second longitudinal sides and first and second narrow sides. The switching devices of the first type and the first diodes are all arranged alternatingly in one row along a first one of the longitudinal sides, the switching devices of the second type and the second diodes are all arranged alternatingly in another row along the second longitudinal side, and the semiconductor arrangement includes an axis of symmetry extending perpendicular to the first and second narrow sides.

Another semiconductor arrangement includes at least two switching devices of a first type, electrically coupled in parallel between a first terminal and a second terminal, and at least two switching devices of a second type, electrically coupled in parallel between the second terminal and a third terminal. The switching devices of the first type and the switching devices of the second type are arranged in a power semiconductor module, the power semiconductor module including first and second longitudinal sides and first and second narrow sides. The switching devices of the first type are arranged in a plurality of first groups, each of the first groups comprising at least two switching devices of the first type arranged in two sub-columns, the switching devices of the second type are arranged in a plurality of second groups, each of the second groups comprising at least two switching devices of the second type arranged in two sub-columns, the plurality of first groups is arranged in one row along a first one of the longitudinal sides, and the plurality of second groups is arranged in one row along a second one of the longitudinal sides. The semiconductor arrangement includes an axis of symmetry extending perpendicular to the first and second longitudinal sides.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
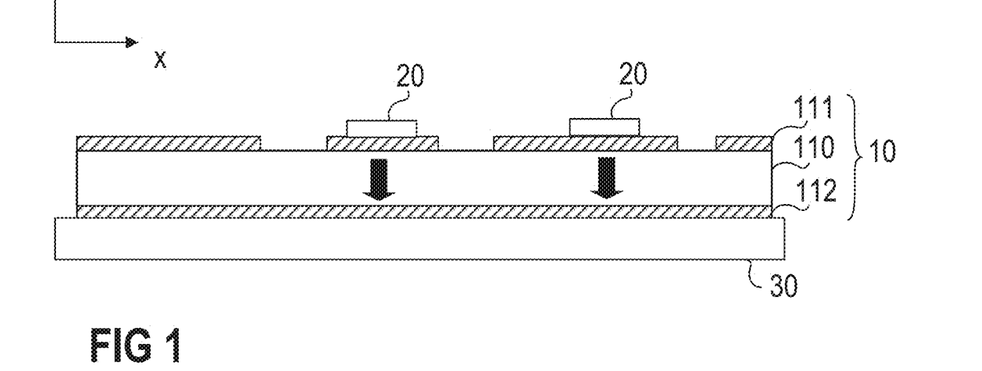
FIG. 1 illustrates a cross-sectional view of a semiconductor substrate arrangement.

FIG. 1 exemplarily illustrates a semiconductor substrate 10. The semiconductor substrate 10 includes a dielectric insulation layer 110, a first metallization layer 111 attached to the dielectric insulation layer 110, and a second metallization layer 112 attached to the dielectric insulation layer 110. The dielectric insulation layer 110 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 is a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate may, e.g., be a Direct Copper Bonding (DCB) substrate, a Direct Aluminium Bonding (DAB) substrate, or an Active Metal Brazing (AMB) substrate. The dielectric insulation layer 110 generally comprises a high insulation resistance while, at the same time, having a low thermal conduction coefficient.

Usually one or more semiconductor bodies 20 are arranged on a semiconductor substrate 10. Each of the semiconductor bodies 20 arranged on a semiconductor substrate 10 may include a controllable semiconductor components such as a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. One or more controllable semiconductor components may form a semiconductor arrangement on the semiconductor substrate 10. In FIG. 1, two semiconductor bodies 20 are exemplarily illustrated. Any other number of semiconductor bodies 20, however, is also possible.

The semiconductor substrate 10 may be attached to a base plate or heat sink 30 with the second metallization layer 112 arranged between the dielectric insulation layer 110 and the base plate/heat sink 30. Heat that is generated by the semiconductor bodies 20 may be dissipated through the semiconductor substrate 10 to the base plate or heat sink 30. This is exemplarily illustrated by the bold arrows in FIG. 1. In the example of FIG. 1, only one substrate 10 is arranged on the base plate 30. This, however, is only an example. It is also possible that two or more substrates 10 are arranged on the same base plate 30.

The second metallization layer 112 of the semiconductor substrate 10 in FIG. 1 is a continuous layer. The first metallization layer 111 is a structured layer in the arrangement illustrated in FIG. 1. "Structured layer" means that the first metallization layer 111 is not a continuous layer, but includes recesses between different sections of the layer. Such recesses are schematically illustrated in FIG. 1. The first metallization layer 111 in this arrangement exemplarily includes four different sections. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires. Electrical connections may also include connection plates or conductor rails, for example, to name just a few examples. This, however, is only an example. The first metallization layer 111 may comprise any number of sections. The first metallization layer 111 may also be a continuous layer.

Figure 2:
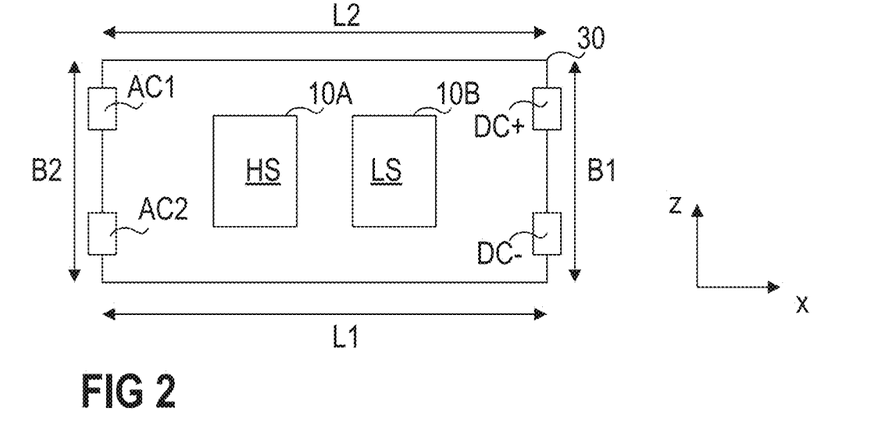
FIG. 2 schematically illustrates a top view of a semiconductor substrate arrangement in a power semiconductor module.

The semiconductor bodies 20 may form a semiconductor arrangement. For example, the semiconductor bodies 20 may comprise switching devices that are arranged in a half-bridge configuration. Such a semiconductor arrangement is exemplarily illustrated in FIG. 2. FIG. 2 illustrates a top view of a power semiconductor module arrangement. The power semiconductor module arrangement may comprise a base plate 30, as has been described with respect to FIG. 1 above. One or more semiconductor substrates 10A, 10B may be arranged on the base plate 30. A plurality of semiconductor bodies (not specifically illustrated in FIG. 2) may form a semiconductor arrangement on the at least one semiconductor substrate 10A, 10B. For example, each of the semiconductor devices may comprise a controllable semiconductor component such as a switching device or a diode. One or more switching devices may be coupled between a first terminal DC+ and a second terminal AC. In particular, each of the switching devices may comprise a control electrode and a controllable load path, the load paths of the different switching devices being operatively connected in parallel and between the first terminal DC+ and the second terminal AC. The first terminal DC+ may be configured to be coupled to a first electrical potential, and the second terminal AC may be configured to be coupled to a load (not illustrated). The first potential may be a positive potential. The switching devices, therefore, may be referred to as high side switches HSn. In the following, such high side switches HSn will also be referred to as switching devices of a first type, irrespective of the kind of switching device (e.g., IGBT, MOSFET, etc.). One or more additional switching devices may be coupled between the second terminal AC and a third terminal DC−. In particular, each of the additional switching devices may comprise a control electrode and a controllable load path, the load paths of the different switching devices being operatively connected in parallel and between the second terminal AC and the third terminal DC−. The third terminal DC− may be configured to be coupled to a second electrical potential. The second potential may be a negative potential. The additional switching devices, therefore, may be referred to as low side switches LSm. In the following, such low side switches LSm will also be referred to as switching devices of a second type, irrespective of the kind of switching device (e.g., IGBT, MOSFET, etc.).

Still referring to FIG. 2, the power semiconductor module has a rectangular cross-section and comprises a first longitudinal side L1, a second longitudinal side L2, a first narrow side B1, and a second narrow side B2. The first and the third terminal DC+, DC− are both arranged on the first narrow side B1 of the power semiconductor module. The second terminal AC is arranged on the second narrow side B2 of the power semiconductor module. In the example of FIG. 2, the third terminal AC comprises two taps AC1, AC2 that are electrically coupled to each other. This, however, is only an example. The third terminal AC may comprise any number x of taps, with x≥1.

In the semiconductor arrangement of FIG. 2, the switching devices of the first type HS form a first group of switching devices that is arranged on a first half of the power semiconductor module. The switching devices of the second type LS form a second group of switching devices that is arranged on a second half of the power semiconductor module. Individual switching devices as well as electrical connections between the switching devices of the first and the second type HS, LS and the terminals DC+, DC−, AC are not specifically illustrated in FIG. 2.

Figure 3:
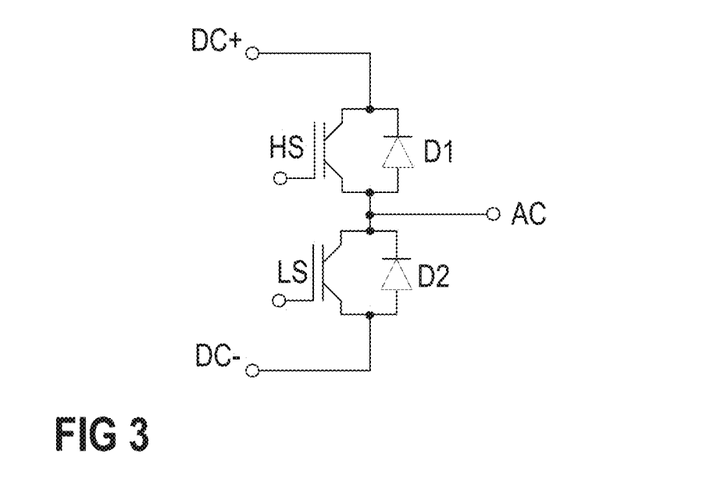
FIG. 3 schematically illustrates a circuit diagram of a half bridge arrangement.
Figure 4:
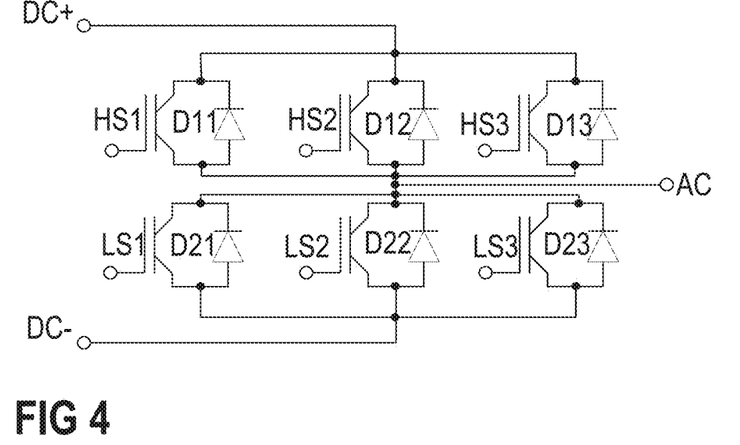
FIG. 4 schematically illustrates a circuit diagram of another half bridge arrangement.

An exemplary circuit diagram of a half-bridge arrangement is schematically illustrated in FIG. 3. As has been described before, a high side switch HS (switching device of the first type) is coupled between the first terminal DC+ and the second terminal AC, and a low side switch LS (switching device of the second type) is coupled between the second terminal AC and the third terminal DC−. The switching devices are implemented as IGBTs in the example of FIG. 3. Each of the switching devices of the first and the second type HS, LS has a diode D1, D2 coupled in parallel between the respective terminals DC+, AC, DC−. In the example of FIG. 3, the high side switch HS is implemented with a single IGBT, and the low side switch LS is implemented with a single IGBT. It is, however, also possible to implement each of the high side switch HS and the low side switch LS with a plurality of IGBTs. This is exemplarily illustrated in FIG. 4. In the example illustrated in FIG. 4, each of the high side switch HS and the low side switch LS is implemented with three IGBTs HS1, HS2, HS3, LS1, LS2, LS3 that are coupled in parallel and between the respective terminals DC+, DC−, AC. Each of the individual switching devices HS1, HS2, HS3, LS1, LS2, LS3 has a diode D11, D12, D13, D21, D22, D23 coupled in parallel between the respective terminals DC+, AC, DC−. Implementing each of the high side switch HS and the low side switch LS with three individual switching devices, however, is only an example. The high side switch HS may generally be implemented by a first plurality n of individual switching devices HSn, with n≥2, and the low side switch LS may generally be implemented by a second plurality m of individual switching devices LSm, with m≥2.

In order to minimize ohmic and inductive losses in the semiconductor arrangement and to avoid thermal hot spots in the arrangement, the switching devices HSn, LSm and the corresponding diodes D1n, D2m may be arranged in the power semiconductor module in an advantageous manner. For example, a high symmetry within the semiconductor arrangement may be preferable. By optimizing the arrangement of the switching devices HSn, LSm and the diodes D1n, D2m, an unequal distribution of electrical losses within the semiconductor arrangement may be prevented. Further, the heat that is generated by the switching devices HSn, LSm and the diodes D1n, D2m during operation of the semiconductor arrangement may be spread over the cross-sectional area of the power semiconductor module such that thermal hotspots may be reduced or avoided. Generally speaking, rapid aging and premature damages of the power semiconductor module may be prevented.

Figure 5:
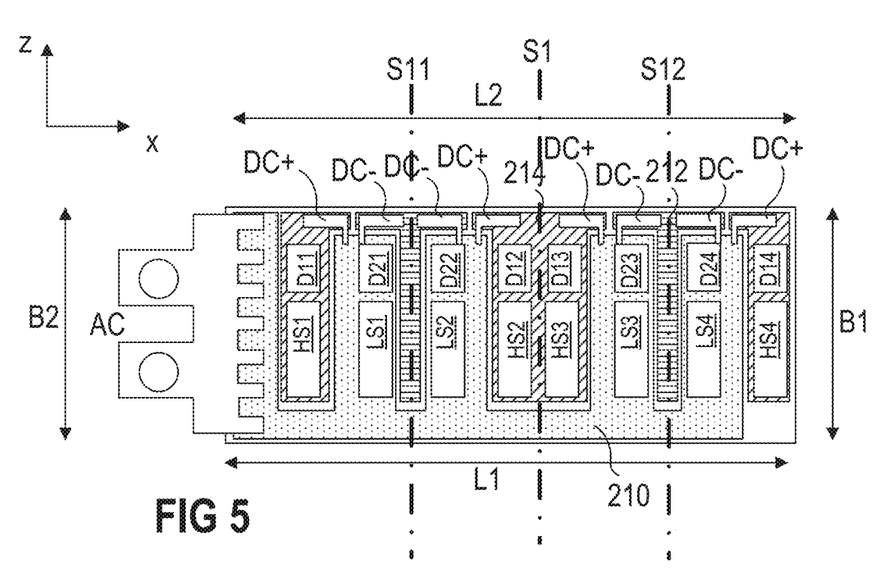
FIG. 5 schematically illustrates a top view of a semiconductor arrangement according to one example.

Now referring to FIG. 5, a semiconductor arrangement according to one example is schematically illustrated. In the example of FIG. 5, the controllable semiconductor devices are arranged in two parallel rows. The two parallel rows extend in a first horizontal direction x. The switching devices of the first type HSn and the switching devices of the second type LSm are all arranged next to each other in one row along a first one of the longitudinal sides L1. The switching devices of the first type HSn and the switching devices of the second type LSm are arranged in a generally alternating fashion. That is, not more than two switching devices of the same type are arranged in direct succession. In the example illustrated in FIG. 5, the switching devices can be described as being arranged in two groups. A first group is arranged on a first side of a first axis of symmetry S1, and a second group is arranged on a second side of the first axis of symmetry S1. Within each group, two switching devices of the second type LSm are arranged directly adjacent to each other and are enclosed on each side by a switching device of the first type HSn. That is, the switching devices of the first type HSn and the switching devices of the second type LSm are arranged such that, except for the two outermost switching devices in the row, each switching device has one neighboring switching device of the same type and one neighboring switching device of the opposite type. In the example of FIG. 5, the outermost switching devices are a first switching devices of the first type HS1 and a fourth switching device of the first type HS4. In this way, the arrangement of FIG. 5 comprises further axes of symmetry. A second axis of symmetry S11 forms an axis of symmetry within the first group of switching devices (i.e., on the first side of the first axis of symmetry), and a third axis of symmetry S12 forms an axis of symmetry within the second group of switching devices (i.e., on the second side of the first axis of symmetry). All axes of symmetry extend perpendicular to the first and second longitudinal sides L1, L2 and in parallel to the narrow sides B1, B2 of the power semiconductor module.

The arrangement illustrated in FIG. 5, however, is only an example. According to another example, the switching devices of the first type HSn and the switching devices of the second type LSm may be reversed. That is, the outermost switching devices in the row may be formed by a first switching device of the second type LS1 and a fourth switching device of the second type LS4. In the example illustrated in FIG. 5, four switching devices of the first type HSn and four switching devices of the second type LSm are illustrated. However, any suitable number of switching devices of the first and second type HSn, LSm is possible. The first number n may equal the second number m.

The first and the second diodes D1n, D2m are all arranged next to each other in a second row along the second longitudinal side L2. Each of the first diodes D1n is arranged adjacent to a switching device of the first type HSn in a second horizontal direction z. That is, several rows are formed that extend parallel to the narrow sides B1, B2, each row comprising one switching device of the first type HSn and one first diode D1n. Each of the second diodes D2m is arranged adjacent to a switching device of the second type LSm in the second horizontal direction z. That is, several rows are formed that extend parallel to the narrow sides B1, B2, each row comprising one switching device of the second type LSm and one second diode D2m. That is, not more than two diodes of the same type are arranged in direct succession in the first horizontal direction x. In the example illustrated in FIG. 5, the diodes D1n, D2m can be described as being arranged in two groups. A first group is arranged on the first side of the first axis of symmetry S1, and a second group is arranged on the second side of the first axis of symmetry S1. Within each group, two second diodes D2m are arranged directly adjacent to each other and are enclosed on each side by a first diode D1n. That is, the first diodes D1n and the second diodes D2m are arranged such that, except for the two outermost diodes in the row, each diode has one neighboring diode of the same type and one neighboring diode of the opposite type.

If the switching devices of the first type HSn and the switching devices of the second type LSm are reversed, the first diodes D1n and the second diodes D2m may also be reversed accordingly. In FIG. 5, each of the switching devices of the first type HSn is illustrated as including a single switching device. This, however, is only an example. Each of the switching devices of the first type HSn may include more than one separate switching device. That is, one of the rows illustrated in FIG. 5 may comprise a first diode D1 and one or more switching devices of the first type HSn. The same applies for the switching devices of the second type LSm. Each of the switching devices of the second type LSm shown in FIG. 5 may comprise more than one separate switching device such that each of the corresponding rows comprises a second diode D2 and one or more switching devices of the second type LSm. It is also possible that each row comprises more than one diode D1, D2. According to one example, the first diode D11 may comprise two separate diodes D111, D112, and the first switching device of the first type HS1 may comprise two separate switching devices HS11, HS12. In order to keep the symmetry, the remaining first diodes D12, D13 and D14 may also each comprise two separate diodes D121, D122, D131, D132, D141, D142, and the second, third and fourth switching device of the first type HS1, HS3 and HS4 may also each comprise two separate switching devices HS21, HS22, HS31, HS32, HS41, HS42. Any other number of diodes D1n, D2m and switching devices HSn, LSm in one row is also possible. Such arrangements, however, are not specifically illustrated in the Figures.

The switching devices of the second type LSm and the second diodes D2m are disposed on a first conductor trace 210. The first conductor trace 210 may be disposed on a carrier, e.g., on a semiconductor substrate 10. For example, the first conductor trace 210 may be a section of a first metallization layer of a semiconductor substrate 10. The first conductor trace 210 may have a comb-like structure. That is, the first conductor trace 210 may comprise a base section that extends in parallel to the longitudinal sides L1, L2 of the power semiconductor module. The first conductor trace 210 may further comprise a plurality of vertical sections that extend in parallel to the narrow sides B1, B2 of the power semiconductor module and perpendicular to the base section. The first conductor trace 210 is illustrated as a dotted area in the example of FIG. 5. The number of the vertical sections generally depends on the number m of switching devices of the second type LSm that are included in the semiconductor arrangement, as each of the switching devices of the second type LSm is disposed on a separate one of the vertical sections of the first conductor trace 210. The first conductor trace 210 may comprise a further vertical section that is arranged adjacent to one of the narrow sides B of the power semiconductor module. No switching device of the second type LSm may be disposed on this further vertical section. However, the second terminal AC may be mechanically and electrically connected to this further vertical section of the first conductor trace 210. For example, the second terminal AC may be arranged at the second narrow side B2 of the power semiconductor module.

The switching devices of the first type HSn and the first diodes D1n are disposed on second conductor traces 214. The second conductor traces 214 may also be disposed on the carrier. For example, the second conductor traces 214 may form further sections of the first metallization layer of a semiconductor substrate 10. Each of the second conductor traces 214, except for an outermost one, may extend between two of the vertical sections of the first conductor trace 210. One or more switching devices of the first type HSn may be disposed on each of the second conductor traces 214. The arrangement may further comprise a plurality of third conductor traces 212. Each of the third conductor traces 212 may extend between two of the vertical sections of the first conductor trace 210. No semiconductor bodies may be disposed on the third conductor traces 212.

Figure 6:
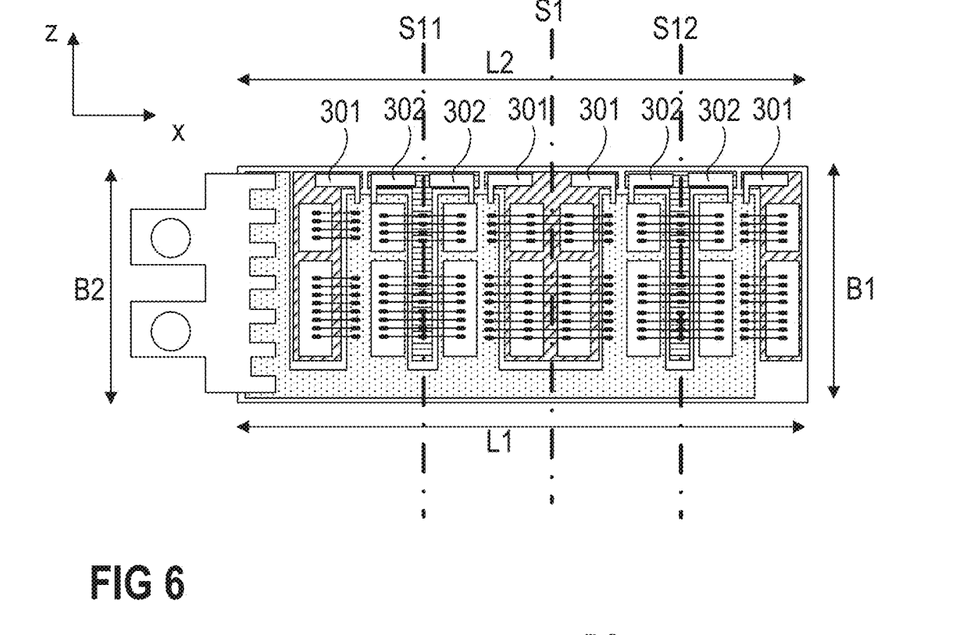
FIG. 6 schematically illustrates electrical connections in the semiconductor arrangement of FIG. 5.

Each of the switching devices HSn, LSm and each of the diodes D1n, D2m may be electrically coupled to another conductor trace by means of bonding wires. This is exemplarily illustrated in FIG. 6. FIG. 6 illustrates the arrangement of FIG. 5. For the sake of clarity, however, reference signs are omitted in FIG. 6. Instead, electrical connections between controllable semiconductor devices and conductor traces are schematically illustrated. Each of the switching devices of the second type LSm and each of the second diodes D2m is electrically coupled to one of the third conductor traces 212. Bonding connections are indicated by fat elongated shapes and bonding wires are indicated by solid lines. Each of the switching devices of the first type HSn and each of the first diodes D1n is electrically coupled to the first conductor trace 210 by means of bonding wires. As can be seen, in the arrangement of FIGS. 5 and 6, all bonding wires may be provided having essentially the same length. Further, the bonding wires may have identical cross-sections and identical electrical properties. In particular, each of the bonding wires may be configured to provide identical voltage and current transfers. In this way, a high symmetry may be reached within the semiconductor arrangement.

Further, thermal hot spots (unequal distribution of heat in the power semiconductor module) can be reduced or avoided. In a half-bridge arrangement comprising a high-side switch and a low-side switch, only one of the two switches is conducting at any point of time. If the high side switch and the low side switch are each implemented with two or more switching devices, all switching devices of the first type are conducting at the same time, while all switching devices of the second type are non-conducting, and vice versa. When one of the switching devices switches from a conducting state into the non-conducting state, the current commutes to the corresponding freewheeling diode. That is, in the arrangement of FIG. 5, when the switching devices of the first type HS1, HS2, HS3, HS4 are in a conducting state, heat is generated by the switching devices of the first type HS1, HS2, HS3, HS4. At the same time, heat is generated in the second diodes D21, D22, D23, D24. Therefore, at each point of time, heat is only generated by one of the two devices that are arranged in each of the short rows parallel to the narrow sides B. Even further, not all of the switching devices HSn, LSm in the first row parallel to the first longitudinal side L1 generate heat at the same time, and not all of the diodes D1n, D2m in the second row parallel to the second longitudinal side L2 generate heat at the same time. The same applies when the switching devices of the second type LS1, LS2, LS3, LS4 are in the conducting state and generate heat. When the switching devices of the second type LSm are in the conducting state, at the same time, heat is generated in the first diodes D11, D12, D13, D14. Generally speaking, devices that generate heat at the same time, are arranged in a zig-zag manner. In this way, heat is distributed in a very advantageous manner within the power semiconductor module.

Figure 7:
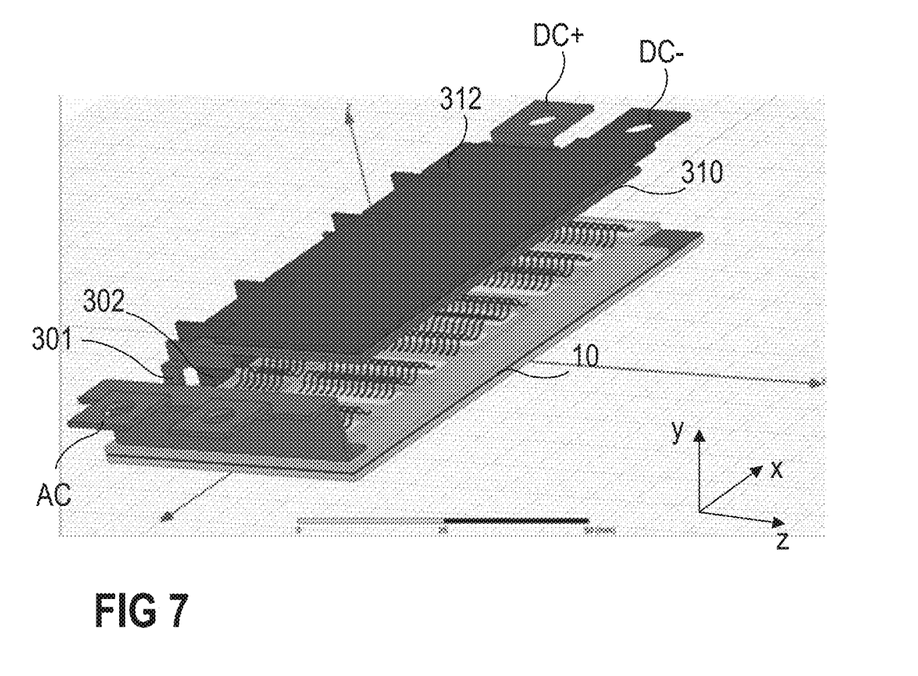
FIG. 7 schematically illustrates a three-dimensional view of an exemplary semiconductor module including the semiconductor arrangement of FIGS. 5 and 6.

As has been described above, the second terminal AC is directly coupled electrically and mechanically to the first conductor trace 210 at the second narrow side B2 of the power semiconductor module. As is schematically illustrated in FIG. 7, the first terminal DC+ and the third terminal DC−, on the other hand, may be arranged at the first narrow side B1 of the power semiconductor module and may be coupled to a first conducting plate 310 and to a second conducting plate 312, respectively. In particular, the first terminal DC+ may be electrically and mechanically coupled to the first conducting plate 310, and the third terminal DC− may be electrically and mechanically coupled to the second conducting plate 312. The first conducting plate 310 and the second conducting plate 312 may not be electrically coupled to each other. According to one example, an electrically insulating layer (not illustrated in FIG. 7) may be disposed between the first conducting plate 310 and the second conducting plate 312. The conducting plates 310, 312 may also be referred to as busbars. In FIG. 7, the first conducting plate 310 is covered by the second conducting plate 312 for the most part, as the second conducting plate 312 is arranged parallel to the first conducting plate 310 in a vertical direction y and in a different plane than the first conducting plate 310. The first and second conducting plates 310, 312 are further arranged in parallel to the carrier 10. The switching devices of the first and second type HSn, LSm, the first and second diodes D1n, D2m, the bonding wires and the first, second and third conducting traces 210, 212, 214 are only schematically indicated in FIG. 7. For the sake of clarity, reference numerals for these parts are omitted in FIG. 7.

The first conducting plate 310 comprises a plurality of first vertical extensions 301 that are configured to mechanically and electrically couple the first conducting plate 310 to the second conductor traces 214. One of the plurality of second conductor traces 214 may be coupled to one or more of the first vertical extensions 301, as is schematically illustrated in FIGS. 5 and 6. In the three dimensional view of FIG. 7, only one first vertical extension 301 is visible, the other first vertical extensions being hidden behind the first and the second conducting plates 310, 312 in this view.

The second conducting plate 312 comprises a plurality of second vertical extensions 302 that are configured to mechanically and electrically couple the second conducting plate 312 to the third conductor traces 212. One of the plurality of third conductor traces 212 may be coupled to one or more of the second vertical extensions 302, as is schematically illustrated in FIGS. 5 and 6. In the three dimensional view of FIG. 7, only one second vertical extension 302 is partly visible, the other second vertical extensions being hidden behind the first and the second conducting plates 310, 312 in this view. In the top views illustrated in FIGS. 5 and 6, it is schematically illustrated at which positions the vertical extensions contact the respective conducting traces. These points are marked DC+ and DC− in FIGS. 5 and 301 and 302 in FIG. 6. The vertical extensions 301, 302 may be arranged close to the second longitudinal side L2 of the power semiconductor module. That is, the vertical extensions 301, 302 may be arranged along an edge of the respective conducting plate 310, 312. This, however, is only an example. According to another example, the first conducting plate 310 and/or the second conducting plate 312 may further comprise additional vertical extensions 301, 302 which are arranged close to the first longitudinal side L1 of the power semiconductor module. While in FIGS. 5 and 6, each conductor trace 212, 214 is contacted at one side, it is also possible to contact at least some of the conductor traces 212, 214 at two sides. For example, each conductor trace 212, 214 may also be contacted close to the respective switching device of the first type HSn, or the respective switching device of the second type LSm. In this way, the overall stray inductance of the power semiconductor module may be decreased.

Providing a plurality of first vertical extensions 301 and a plurality of second vertical extensions 302 along the second longitudinal side L2 allows for a better symmetry of the semiconductor arrangement. The semiconductor arrangement may be electrically contacted at several different positions. In this way, each of the conductor traces 212, 214 may be contacted directly. In some power semiconductor modules, only one first conductor trace 212 is contacted by a vertical extension 301. An electrical connection between the first one of the first conductor traces 212 and a second one of the first conductor traces 212 may be implemented by means of bonding wires. However, this decreases the symmetry of the arrangement and results in several disadvantages. Contacting each of the conductor traces 212, 214 directly by means of at least one vertical extension 301, 302 may have several advantages. For example, distances in the semiconductor arrangement may be kept short in this way. Further, the bonding wires that are needed to provide electrical connections within the semiconductor arrangement may be comparably short.

Figure 8:
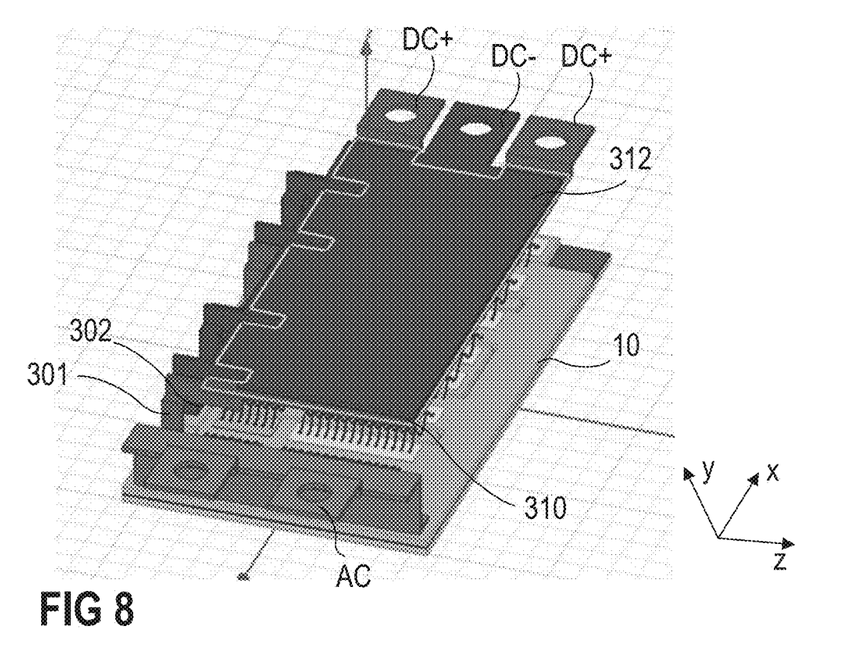
FIG. 8 schematically illustrates a three-dimensional view of another exemplary semiconductor module including the semiconductor arrangement of FIGS. 5 and 6.
Figure 9:
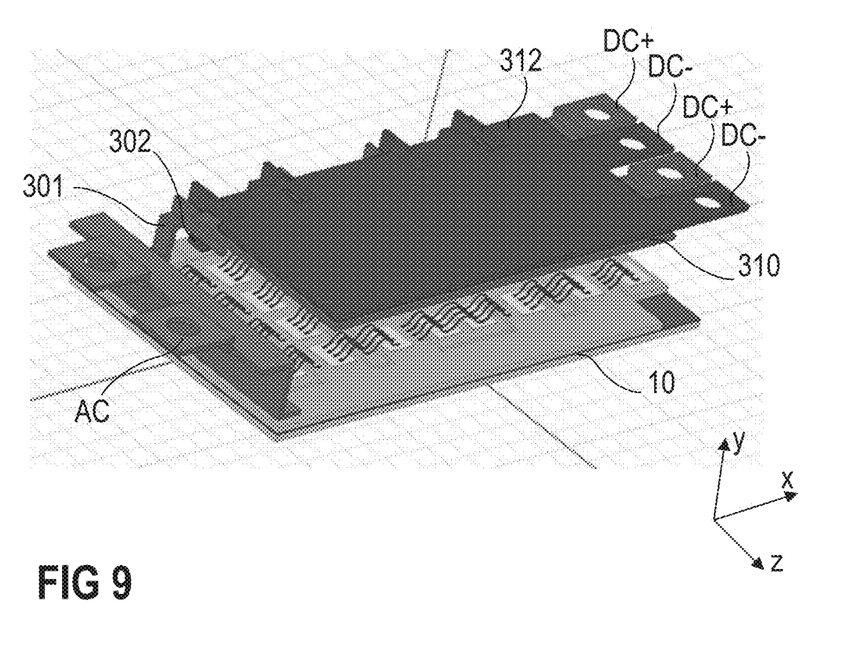
FIG. 9 schematically illustrates a three-dimensional view of another exemplary semiconductor module including the semiconductor arrangement of FIGS. 5 and 6.

In the example illustrated in FIG. 7, one first terminal DC+ and one third terminal DC− are provided. That is, one tap DC+ is provided for electrically contacting the first conducting plate 310, and one tap DC− is provided for electrically contacting the second conducting plate 312. This, however, is only an example. It is also possible to provide more than one tap for contacting each of the conducting plates 310, 312. For example, it is also possible that the arrangement comprises two taps DC+ for electrically contacting the first conducting plate 310 and one tap DC− for contacting the second conducting plate 312 (see, e.g., FIG. 8), or vice versa (not illustrated). As is illustrated in FIG. 9, it is also possible to provide two taps DC+ for electrically contacting the first conducting plate 310, and two taps DC− for electrically contacting the second conducting plate 312. Any other number of taps is also possible. In the Figures, the taps AC, DC+ and DC− are illustrated comprising holes. This allows for bolted connections to be made between the power semiconductor arrangement and any external components. Such tabs, however, are only one example. Electrical connections to other components may be formed in any other suitable way. For example, welded connections may be formed between the conducting plates 310, 312 and any external components. Other exemplary connections include press-fit connections or linear pressure contacts. Any other suitable types of contacts are also possible.

The semiconductor bodies that are illustrated in FIGS. 5 to 9 each have a rectangular shape (cross-section). Square-shaped semiconductor bodies are also possible, however, using switching devices HSn, LSm and diodes D1n, D2m that have a rectangular shape allows to build an overall semiconductor arrangement having an advantageous form. For example, a length of the semiconductor arrangement in a first horizontal direction x (e.g., length from the first switching device of the first type HS1 to the fourth switching device of the first type HS4) may be significantly greater than a width of the semiconductor arrangement in a second horizontal direction z (e.g., length from a switching device of the first type HSn to a neighboring first diode D1n). The semiconductor arrangement mainly extends along the longitudinal sides L1, L2 and has a narrow form in the second horizontal direction z, but an elongated form in the first horizontal direction x.

FIG. 9 schematically illustrates a semiconductor arrangement comprising only switching devices HSn, LSm. No diodes are included in this arrangement. For example, the switching devices HSn, LSm in this example may be implemented as SiC MOSFET devices. When using SiC MOSFET devices, no additional diodes are required. The general structure of a semiconductor arrangement comprising MOSFETs instead of IGBTs, however, may be the same as has been described with respect to FIGS. 5 to 8 above. Two or more switching devices of the same type HSn, LSm may be arranged next to each other in the second vertical direction z. In this way, several rows may be formed in parallel to the narrow sides B1, B2. Each of these short rows may comprise only switching devices of the same type. The sequence of switching devices in the long rows extending in parallel to the longitudinal sides L1, L2 may be the same as has been described with respect to FIG. 5 above (e.g., not more than two switching devices of the same type in direct succession).

Figure 10:
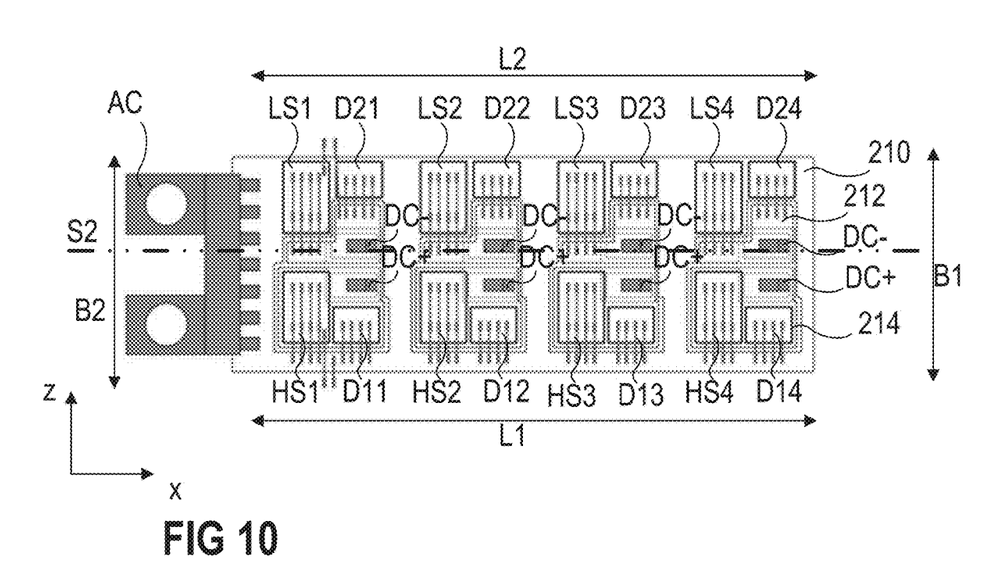
FIG. 10 schematically illustrates a top view of a semiconductor arrangement according to another example.

An alternative arrangement is exemplarily illustrated in FIG. 10. In the example of FIG. 10, the power semiconductor arrangement also has a rectangular shape, having first and second longitudinal sides L1, L2 and first and second narrow sides B1, B2. This arrangement also provides a solution that may minimize or prevent thermal hot spots, and reduce losses due to a symmetrical arrangement of the semiconductor bodies. In the arrangement of FIG. 10, the switching devices of the first type HSn and the first diodes D1n are arranged alternatingly in a first row along the first longitudinal side L1 of the power semiconductor arrangement. The switching devices of the second type LSm and the second diodes D2m are arranged alternatingly in a second row along the second longitudinal side L2. In the second horizontal direction z, each switching device of the second type LSm is arranged adjacent to a switching device of the first type HSn, and each second diode D2m is arranged adjacent to a first diode D1n. In this way, a plurality of short rows is formed in the second horizontal direction z that is arranged parallel to the narrow sides B1, B2, each row comprising either two switching devices of different types of two diodes of different types. An axis of symmetry S2 extends between the two long rows that extend along the longitudinal sides L1, L2. This axis of symmetry S2 extends parallel to the longitudinal sides L1, L2 and perpendicular to the narrow sides B1, B2.

Figure 11:
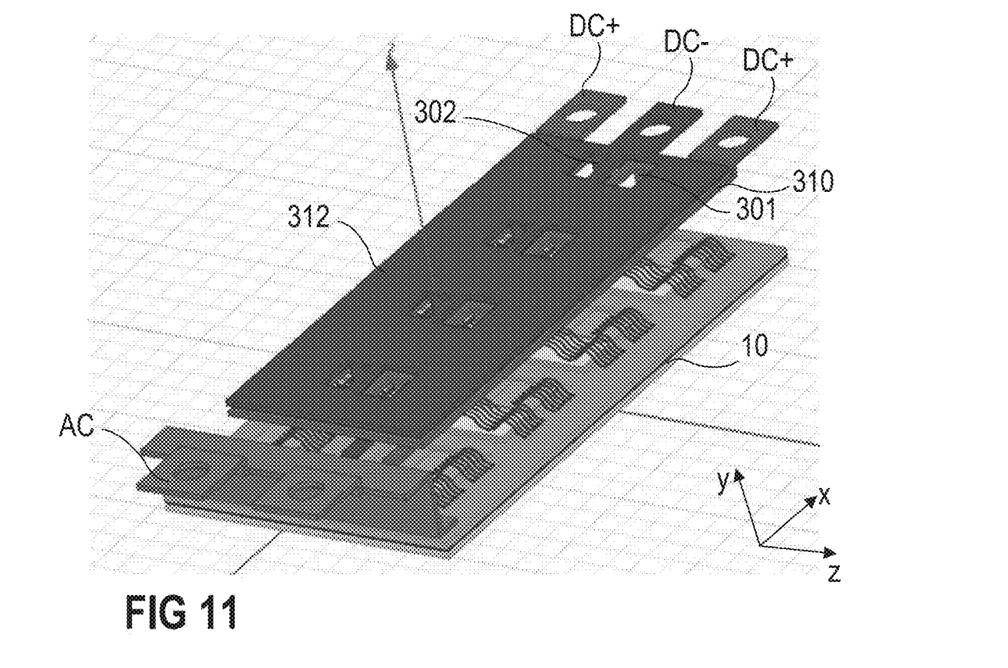
FIG. 11 schematically illustrates a three-dimensional view of an exemplary power semiconductor module including the semiconductor arrangement of FIG. 10.

In the example of FIG. 10, the first conducting trace 210 has a grid-like shape. That is, the first conducting trace 210 may have two base sections that extend in parallel to the first and second longitudinal sides L1, L2. The first conducting trace 210 may further comprise vertical sections extending between the two base sections, perpendicular to the base sections and in parallel to the narrow sides B1, B2. The second and third conducting traces 212, 214 are arranged to be surrounded by the first conducting trace 210 in a vertical plane. The second and third conducting traces 212, 214 may each be L-shaped, square shaped or rectangular, for example. The second terminal AC is electrically and mechanically coupled to the first conducting trace in a similar fashion as has been described with respect to FIG. 5 above. The connections to the first terminal DC+ and to the third terminal DC−, however, are provided in a middle part of the semiconductor arrangement. That is, the vertical extensions 301, 302 are not arranged in an edge region of the power semiconductor module (see, e.g., FIGS. 5 to 9), but rather in a middle section of the power semiconductor module (see FIG. 10). This is also illustrated in the three dimensional view of the semiconductor arrangement that is illustrated in FIG. 11. While in the arrangement of FIGS. 5 to 9 the vertical extensions 301, 302 are arranged at the perimeter of the conducting plates 310, 312, in the example illustrated in FIGS. 10 and 11 the vertical extensions 301, 302 are arranged at a central portion of the conducting plates 310, 312. In the example illustrated in FIGS. 10 and 11, the commutation paths run along the short module axis.

While in the example of FIGS. 5 to 9, the bonding wires extend in the first horizontal direction x parallel to the longitudinal sides L1, L2, the bonding wires in the example of FIGS. 10 and 11 extend in the second horizontal direction z parallel to the narrow sides B1, B2.

The switching devices HSn, LSm in the example of FIGS. 10 and 11 may comprise IGBTs, as has been described above. Any other switching devices, however, may also be used. For example, it is possible to implement the arrangement using SiC MOSFET devices. As has been described above, such SiC MOSFET devices do not require additional diodes. Therefore, it is also possible to omit the diodes that are illustrated in FIGS. 10 and 11.

Figure 12:
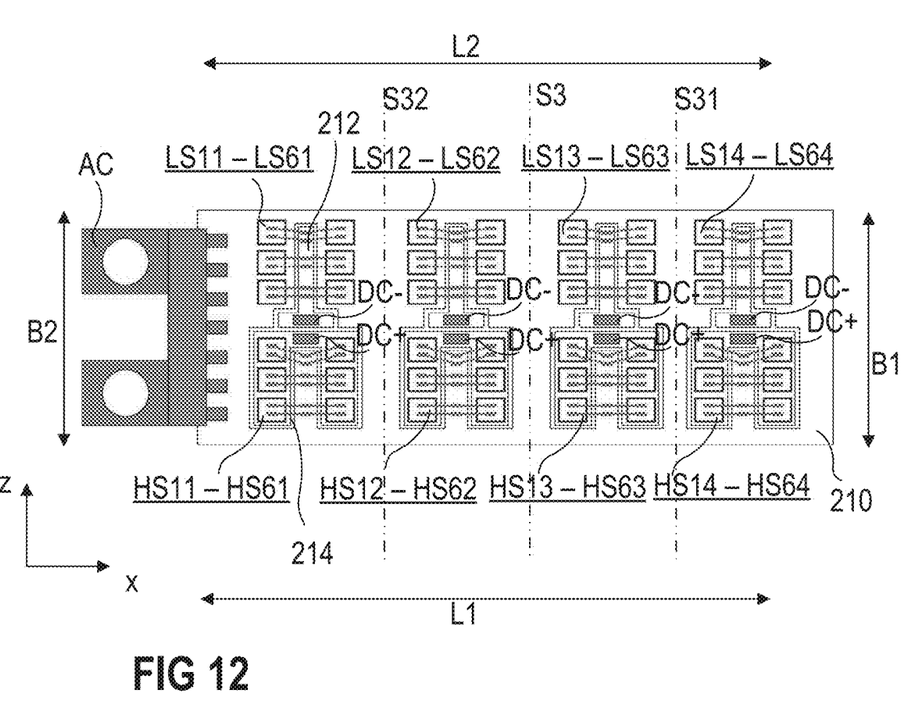
FIG. 12 schematically illustrates a top view of a semiconductor arrangement according to another example.

A further alternative arrangement is schematically illustrated in FIG. 12. In the example of FIG. 12, the switching devices HSn, LSm are implemented as SiC MOSFET devices that do not require additional diodes. The semiconductor arrangement of FIG. 12 comprises a plurality of switching devices of the first type HSn, and a plurality of switching devices of the second type LSm. The switching devices of the first type HSn are arranged in a plurality of first groups on a first side of the power semiconductor module (along a first one of the longitudinal sides), and the switching devices of the second type LSm are arranged in a plurality of second groups on a second side of the power semiconductor module arrangement (along a second one of the longitudinal sides). The plurality of first groups is arranged in one row, and the plurality of second groups is arranged in a second row. That is, each of these two rows only comprises switching devices of either the first type HSnx or the second type LSmy.

Two or more columns may be arranged next to each other in the first horizontal direction x. Each column may comprise one first group of switching devices of the first type HSnx, and one second group of switching devices of the second type LSmy. In the example illustrated in FIG. 12, each first group comprises six switching devices of the first type HSnx and six switching devices of the second type LSmy. This, however, is only an example. Any other number of first switching devices HSnx in a first group, and of second switching devices LSmy in a second group is also possible. The switching devices within each first group may be arranged in two sub-columns, and the switching devices within each second group may be arranged in two sub-column. In the example illustrated in FIG. 12, each sub-column includes three switching devices of the first type HSnx, and three switching devices of the second type LSmy. An axis of symmetry S3 extends between two columns in parallel to the narrow sides B1, B2 and perpendicular to the longitudinal sides L1, L2. Depending on the number of first and second groups, the arrangement may comprise more than one axis of symmetry. In the given example, the arrangement comprises two further axes of symmetry S31, S32, one on each side of the first axis of symmetry S3. Each first group and each second group may further be symmetric in itself.

Each first group comprises a second conducting trace 214, and each second group comprises a third conducting trace 212. Each second conducting trace 214 has a U-shape, and each third conducting trace 212 has a T-shape in the example of FIG. 12. The switching devices of the first type HSnx each are arranged on one of the second conducting traces 214, and the switching devices of the second type LSmy each are arranged on the first conducting trace 210. Each second conducting trace 214 and each third conducting trace 212 is, at least partly, surrounded by the first conducting trace 210. The first conducting trace 210 may comprise extensions which extend partly in between two sub-columns of switching devices of the first type HSnx of each first group. The third conducting trace 212 may partly extend between the two sub-columns of switching devices of the second type LSmy of each second group. In this way, short bonding wires may be provided to electrically couple the switching devices of the first type HSnx to the first conducting trace 210, and to electrically connect the switching devices of the second type LSmy to the third conducting trace 212. Connections to the first terminal DC+ (via a vertical extension and a first conducting plate that are not specifically illustrated in FIG. 12), and to the third terminal DC− (via a vertical extension and a second conducting plate that are not specifically illustrated in FIG. 12) may be provided in a central part of the power semiconductor module between the row of first groups and the row of second groups.

The arrangement illustrated in FIG. 12 is also highly symmetrical. Electrical connections, e.g., bonding wires, may be very short. The electrical potential may be distributed towards the switching devices HSnx, LSmy via the second and third conducting traces 212, 214, respectively. Inductive and ohmic losses in the arrangement are reduced as compared to known arrangements.

In the Figures, only elements that are necessary for the understanding of the invention are illustrated. The arrangements according to the examples described above, however, may further include additional elements such as additional conductor tracks or additional semiconductor devices, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A semiconductor arrangement, comprising:
   at least two switching devices of a first type electrically coupled in parallel between a first terminal and a second terminal; and
   at least two switching devices of a second type electrically coupled in parallel between the second terminal and a third terminal,
   wherein the at least two switching devices of the first type and the at least two switching devices of the second type are arranged in a power semiconductor module, the power semiconductor module comprising first and second longitudinal sides and first and second narrow sides,
   wherein the at least two switching devices of the first type and the at least two switching devices of the second type are arranged next to each other in at least one row extending in a first horizontal direction that is parallel to the first and second longitudinal sides, such that within each of the at least one rows no more than two switching devices of the same type are arranged in direct succession.

2. The semiconductor arrangement of claim 1, wherein the at least two switching devices of the first type and the at least two switching devices of the second type within each row are arranged such that, except for the two outermost switching devices of the respective row, each switching device has one neighboring switching device of the same type and one neighboring switching device of the opposite type.

3. The semiconductor arrangement of claim 1, wherein the semiconductor arrangement has at least one axis of symmetry that extends in parallel to the first and second narrow sides and perpendicular to the first and second longitudinal sides.

4. The semiconductor arrangement of claim 1, wherein the first terminal is configured to be operatively coupled to a first electrical potential, wherein the first potential is a positive potential, wherein the third terminal is configured to be operatively coupled to a second electrical potential, wherein the second potential is a negative potential, and wherein the second terminal is configured to be coupled to a load.

5. The semiconductor arrangement of claim 1, wherein the first terminal and the third terminal are arranged at the first narrow side, and wherein the second terminal is arranged at the second narrow side.

6. The semiconductor arrangement of claim 1, wherein the at least two switching devices of the second type are disposed on a first conductor trace, wherein the first conductor trace is disposed on a carrier and has a comb-shaped structure comprising a base section extending in parallel to the first and second longitudinal sides and a plurality of vertical sections extending perpendicular to the base section and in parallel to the first and second narrow sides, and wherein the second terminal is mechanically and electrically coupled to an outermost of the vertical sections of the first conductor trace such that the first conductor trace is electrically coupled between the second terminal and the at least two switching devices of the second type.

7. The semiconductor arrangement of claim 6, wherein the first terminal is coupled to a first electrically conducting plate which extends in a vertical direction above the carrier and in parallel to the carrier, and wherein the third terminal is coupled to a second electrically conducting plate which extends in the vertical direction above the carrier and in parallel to the carrier and the first electrically conducting plate.

8. The semiconductor arrangement of claim 7, wherein the first conducting plate comprises a plurality of first vertical extensions configured to mechanically and electrically couple the first conducting plate to a multiplicity of second conductor traces, and wherein each of the at least two switching devices of the first type is disposed on one of the second conductor traces.

9. The semiconductor arrangement of claim 7, wherein the second conducting plate comprises a plurality of second vertical extensions configured to mechanically and electrically couple the second conducting plate to a multiplicity of third conductor traces.

10. The semiconductor arrangement of claim 9, further comprising:
a plurality of bonding wires configured to electrically couple each of the at least two switching devices of the second type to one of the third conductor traces.

11. The semiconductor arrangement of claim 7, further comprising:
a plurality of bonding wires configured to electrically couple the at least two switching devices of the first type to the first conductor trace.

12. The semiconductor arrangement of claim 1, further comprising:
a plurality of first diodes and a plurality of second diodes,
wherein one of the plurality of first diodes is electrically coupled in parallel to each of the at least two switching devices of the first type,
wherein one of the plurality of second diodes is electrically coupled in parallel to each of the at least two switching devices of the second type,
wherein the first diodes and the second diodes are all arranged next to each other in one row along the second longitudinal side such that, in the second horizontal direction, each of the first diodes is arranged adjacent to one of the switching devices of the first type and each of the second diodes is arranged adjacent to one of the switching devices of the second type.

13. The semiconductor arrangement of claim 1, wherein at least one of each of the at least two switching devices of the first type comprises an IGBT or a MOSFET, and wherein each of the at least two switching devices of the second type comprises an IGBT or a MOSFET.

14. A semiconductor arrangement, comprising:
at least two switching devices of a first type electrically coupled in parallel between a first terminal and a second terminal; and
at least two switching devices of a second type electrically coupled in parallel between the second terminal and a third terminal,
wherein the at least two switching devices of the first type and the at least two switching devices of the second type are arranged in a power semiconductor module, the power semiconductor module comprising first and second longitudinal sides and first and second narrow sides,
wherein the at least two switching devices of the first type are arranged in a plurality of first groups, each of the first groups comprising at least two switching devices of the first type arranged in two sub-columns,
wherein the at least two switching devices of the second type are arranged in a plurality of second groups, each of the second groups comprising at least two switching devices of the second type arranged in two sub-columns,
wherein the plurality of first groups is arranged in one row along the first longitudinal side,
wherein the plurality of second groups is arranged in one row along the second longitudinal side,
wherein the semiconductor arrangement has an axis of symmetry that extends perpendicular to the first and second longitudinal sides.

15. The semiconductor arrangement of claim 14, wherein the first terminal is configured to be operatively coupled to a positive potential, wherein the third terminal is configured to be operatively coupled to a negative potential, and wherein the second terminal is configured to be coupled to a load.

16. The semiconductor arrangement of claim 14, wherein at least one of each of the at least two switching devices of the first type comprises an IGBT or a MOSFET, and wherein each of the at least two switching devices of the second type comprises an IGBT or a MOSFET.

* * * * *